*(12)* United States Patent
Gillette et al.

(10) Patent No.: US 6,171,114 B1
(45) Date of Patent: Jan. 9, 2001

(54) LOW INSERTION FORCE ARRAY CONNECTOR FOR PROVIDING A REMOVABLE HIGH DENSITY ELECTRICAL INTERCONNECT TO A FLEXIBLE CIRCUIT

(75) Inventors: Joseph G. Gillette, Margate; Scott G. Potter, Coconut Creek; Robert J. Mulligan, Lauderhill, all of FL (US)

(73) Assignee: Motorola, Inc., Schaumburg, IL (US)

( * ) Notice: Under 35 U.S.C. 154(b), the term of this patent shall be extended for 0 days.

(21) Appl. No.: 09/593,884

(22) Filed: Jun. 14, 2000

Related U.S. Application Data

(63) Continuation of application No. 09/267,429, filed on Mar. 12, 1999.

(51) Int. Cl.[7] .............................. H01R 12/00; H05K 1/00
(52) U.S. Cl. .................................................. 439/67
(58) Field of Search ................................ 439/67, 55, 65, 439/91, 74, 77, 85, 495; 361/776, 784, 789, 826

(56) References Cited

U.S. PATENT DOCUMENTS

| | | | |
|---|---|---|---|
| 3,629,787 | 12/1971 | Wilson | 439/69 |
| 3,885,173 | * 5/1975 | Lee | 310/313 B |
| 5,219,292 | * 6/1993 | Dickirson et al. | 439/67 |
| 5,482,473 | * 1/1996 | Lord et al. | 439/67 |
| 5,627,730 | 5/1997 | Konig et al. | 361/784 |
| 5,742,484 | 4/1998 | Gillette et al. | 361/789 |
| 5,810,607 | 9/1998 | Shih et al. | 439/66 |
| 5,825,628 | 10/1998 | Garbelli et al. | 361/763 |
| 5,872,700 | 2/1999 | Collander | 361/760 |
| 5,947,750 | 9/1999 | Alcoe et al. | 439/67 |
| 6,017,244 | * 1/2000 | Daane | 439/495 |

* cited by examiner

*Primary Examiner*—Neil Abrams
*Assistant Examiner*—Michael C. Zarroli
(74) *Attorney, Agent, or Firm*—Dale W. Dorinski

(57) ABSTRACT

A high density electrical interconnect is achieved by incorporating a flexible circuit (140) that is removably connected to a low insertion force, ball grid array connector (100). The flexible circuit has a plurality of conductive runners (142), and each of the runners has a termination (144). The terminations are arranged in an array on the end of the flexible circuit. The low insertion force connector consists of a substrate (120) that has a pattern of pads (122) corresponding to the array on one side. The other side of the substrate has a corresponding array (124) that is electrically connected to the pads by conductive vias. An alignment feature (470) aligns the array on the flexible circuit to the pattern of pads on the substrate. Contact between the flexible circuit and the substrate is maintained by a compression means (150) that provides sufficient compressive force (310) to establish electrical connection between the array and the pads. The flexible circuit is removably connected to the low insertion force connector by insertion through the z-axis (149) of the substrate.

12 Claims, 4 Drawing Sheets

LOW INSERTION FORCE ARRAY CONNECTOR FOR PROVIDING A REMOVABLE HIGH DENSITY ELECTRICAL INTERCONNECT TO A FLEXIBLE CIRCUIT

CROSS REFERENCE TO RELATED APPLICATIONS

This is a continuation of application Ser. No. 09/267,429, filed Mar. 12, 1999, and assigned to Motorola, Inc.

TECHNICAL FIELD

This invention relates in general to electrical interconnections, and more specifically, to a system for providing a removable, high density electrical interconnect.

BACKGROUND

Miniaturization and decreasing feature size is a fact of life in the electronics industry. The relentless demand for reduced size continues to drive every facet of the packaging business. However, advances in board-to-board interconnections and board-to-flex interconnections have not kept pace with the advances in the semiconductor industry, and are lagging behind the race for higher and higher interconnect densities. Interconnect system manufacturers have been forced to decrease the pitch and size of leads, thus compromising manufacturability and reliability. Consequently, input/output (I/O) counts for zero-insertion force (ZIF) and low-insertion force (LIF) connectors have come to a standstill, and are plateaued around 50 I/O. These types of connectors provide electrical contact by bringing together two components under very low force, then pressing them together in a z-axis direction. Chip-scale technology is demanding interconnects of 200–400 I/O today, and 1500 I/0 per $in^2$ will soon be needed. Conventional ZIF and LIF connector size is limited by tolerances of the molding process. For example the molded body of very large high I/O count ZIF connector tends to warp, leading to non-coplanar leads. One solution to this problem is to decrease pitch and size, but this compromises manufacturability and reliability. The interconnect industry is a multi-billion dollar market worldwide, thus, a need and a ready market exists for a high density interconnect system. Clearly, today's conventional approach of linear connectors that utilize a single side of the printed circuit board (PCB) or flexible circuit will not meet the need, and even using both sides of the board is only a marginal improvement.

DETAILED DESCRIPTION OF THE PREFERRED EMBODIMENT

Figure 1:
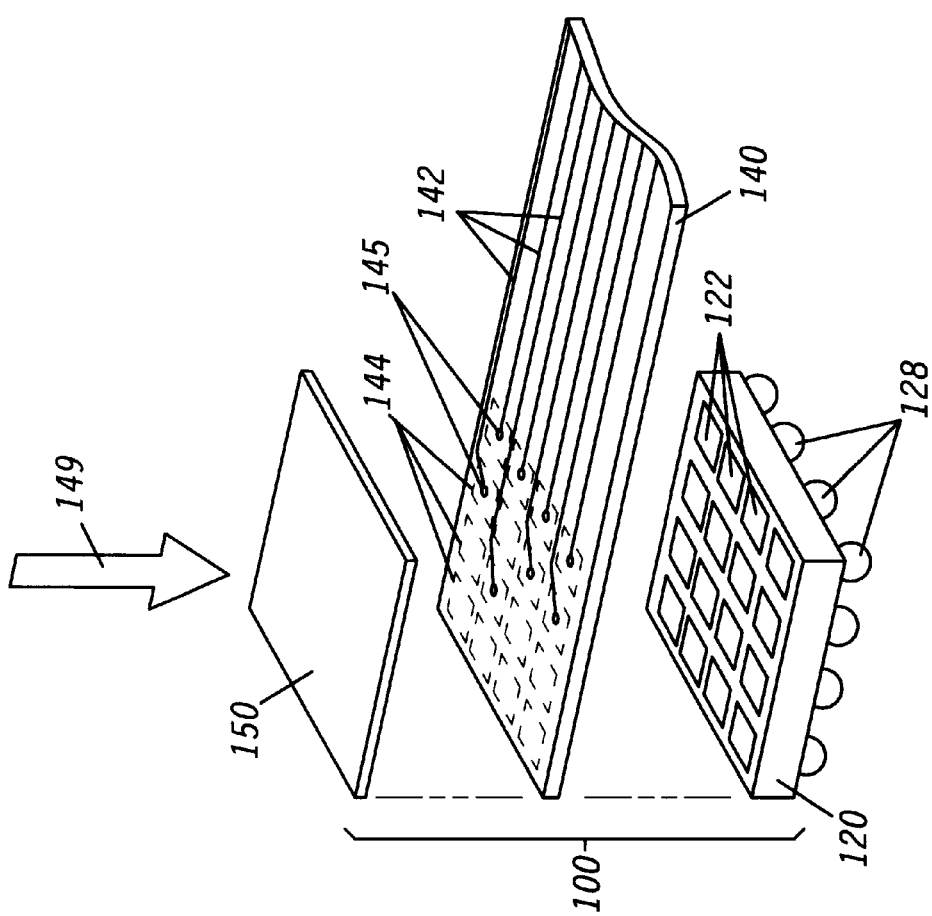
FIG. 1 an exploded view of an area efficient interconnect system in accordance with the invention.

A high density electrical interconnect is achieved by incorporating a flexible circuit that is removably connected to a low insertion force, ball grid array connector. The flexible circuit has a plurality of conductive runners, and each of the runners has a termination. The terminations are arranged in an array on the end of the flexible circuit. The low insertion force connector receives the flexible circuit and mates to the array. The low insertion force connector consists of a substrate that has a pattern of pads corresponding to the array on one side. The other side of the substrate has a corresponding array of pins, leads or terminations that are electrically connected to the pads by conductive vias. The connector also has an alignment feature to align the array on the flexible circuit to the pattern of pads on the substrate. Contact between the flexible circuit and the substrate is maintained by a compression means that provides sufficient compressive force to establish electrical connection between the array and the pads. The flexible circuit is removably connected to the low insertion force connector by insertion through the z-axis of the substrate.

While the specification concludes with claims defining the features of the invention that are regarded as novel, it is believed that the invention will be better understood from a consideration of the following description in conjunction with the drawing figures, in which like reference numerals are carried forward.

Figure 2:
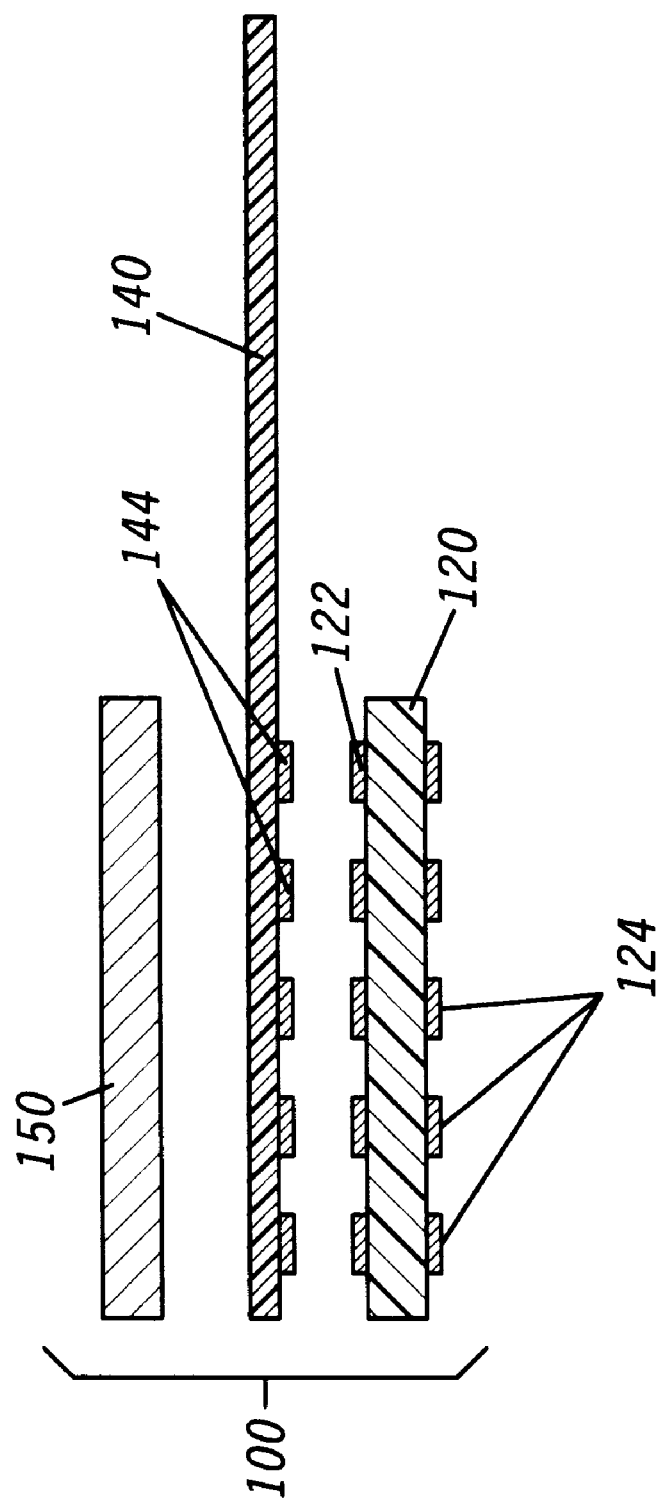
FIG. 2 is a cross-sectional exploded view of FIG. 1.

Referring now to FIGS. 1 and 2, an exploded view of the invention is depicted. A zero-insertion force (ZIF) or low-insertion force (LIF) type of connector 100 consists of a substrate 120 (such as plastic or a glass reinforced printed circuit board material) with electrical contact pads 122, 124 on its top surface and its opposing bottom surface. The pads are generally arranged in multiple rows or, preferably, in an array. For purposes of our invention, by 'array' we mean a matrix of regularly or irregularly spaced pads in a matrix of greater than X by Y, where X and Y are each integers equal to or greater than 2. The array can be a perimeter array or an area array. Perimeter and area arrays are well known to those skilled in the packaging art, and will not be further elaborated upon here, except to say that perimeter arrays generally have an open area in the center of the array, and that an 'area array' is a regularly spaced matrix greater than 2 by 2 that does not have an open area. The pads 122 on the top surface are interconnected to the pads 124 on the bottom surface by means of offset or in-pad vias (not shown). Any number of via technologies can be used to achieve this, such as plated through holes, blind vias, solder filled vias, pins, etc. In the preferred embodiment, the substrate is bumped by attaching a solder ball 128 to the pads on the bottom surface of the substrate for interconnection to a corresponding array of interconnections on a motherboard PCB 360, similar to the well known ball grid array.

A flexible circuit (also known as a flexible printed circuit, flex circuit or, simply, a flex) 140 typically contains, among other items, a plurality of electrically conductive runners or traces 142 on a single side, on both sides, or it may have multiple layers, depending on the density and routing requirements of the array arrangement. Each of the runners 142 typically terminates in a terminal portion 144, such as a pad, and these pads are arranged in an array that corresponds to the array of pads 122 on the top surface of the substrate 120. The pads 144 on the flex circuit 140 are on the bottom side of the flex, so as to easily mate to the substrate. If the flex circuit is a single sided flex, then obviously the runners 142 are on the bottom side of the flex so that the array of terminations would be in the proper location. FIG. 1 depicts the case employing a double sided flex, where the runners 142 are on the top side of the flex, and the array of terminations 144 on the bottom side is connected to the runners by means of a conductive vias 145. In the preferred embodiment, the array of terminations 144 is on or near one end of the flex. This provides a ready means of interconnection between the flex and the ZIF. However, alternate embodiments of our invention find the array positioned away from the end of the flex, for example, near the middle. This allows one to utilize our high density interconnect system to route to multiple locations on a PCB.

Figure 3:
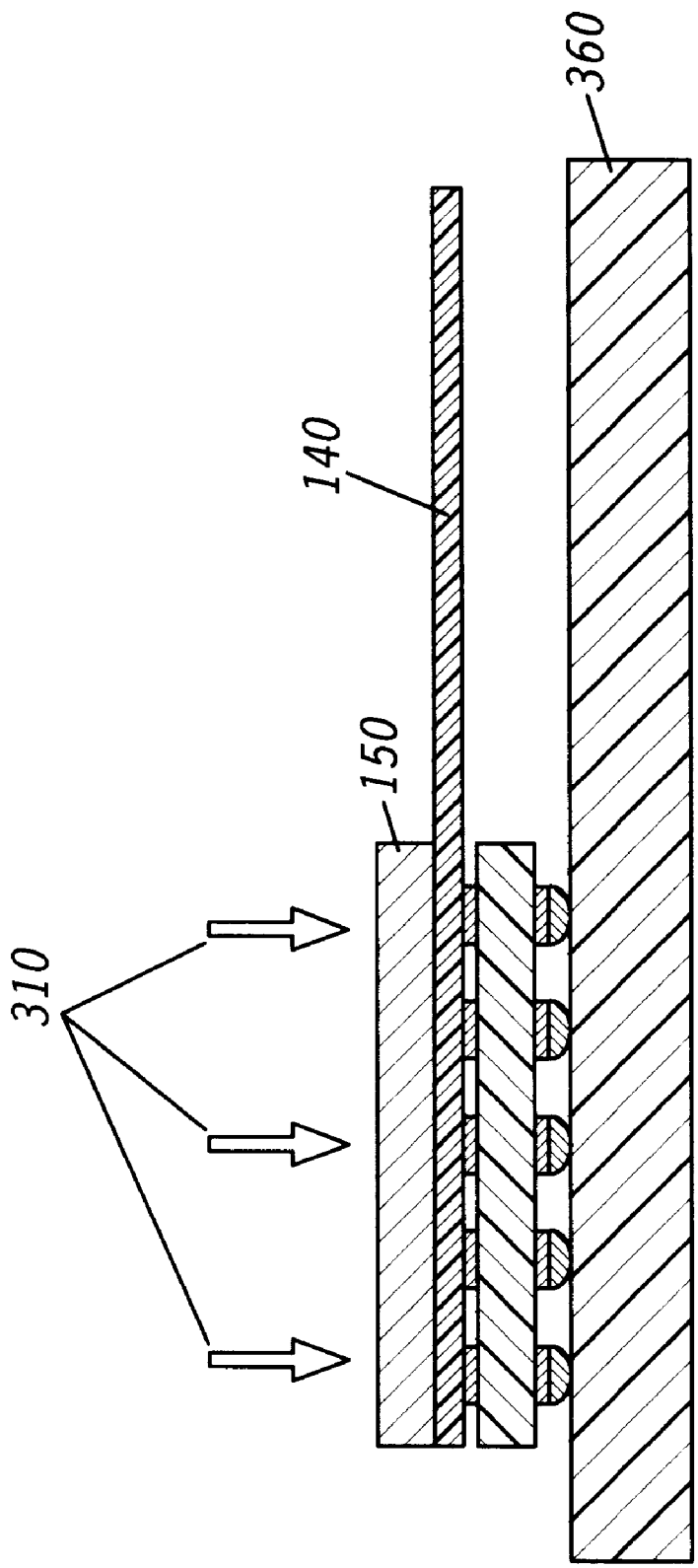
FIG. 3 is a cross-sectional assembled view of FIG. 2.

The array of pads 144 on the flex is mated to the array of pads 122 on the substrate by mating the flex to the substrate through a motion corresponding to the z-axis of the substrate, as depicted by arrow 149. Put another way, the flex array is mated to the substrate array by top-down interconnecting. This is in stark contrast to the conventional linear interconnections used for flex circuits and their connectors that mates the flex to the connector by inserting in the X or Y axis, that is, in a direction co-planar to the major plane of the flex circuit. FIG. 3 depicts how a compression means 150, such as a rigid cover, is used to provide sufficient force to press the pad array 144 on the flex 140 against the mating pad array 122 on the top surface of the substrate, distributing pressure equally (as shown by arrows 310) and generating electrical contact.

Figure 4:
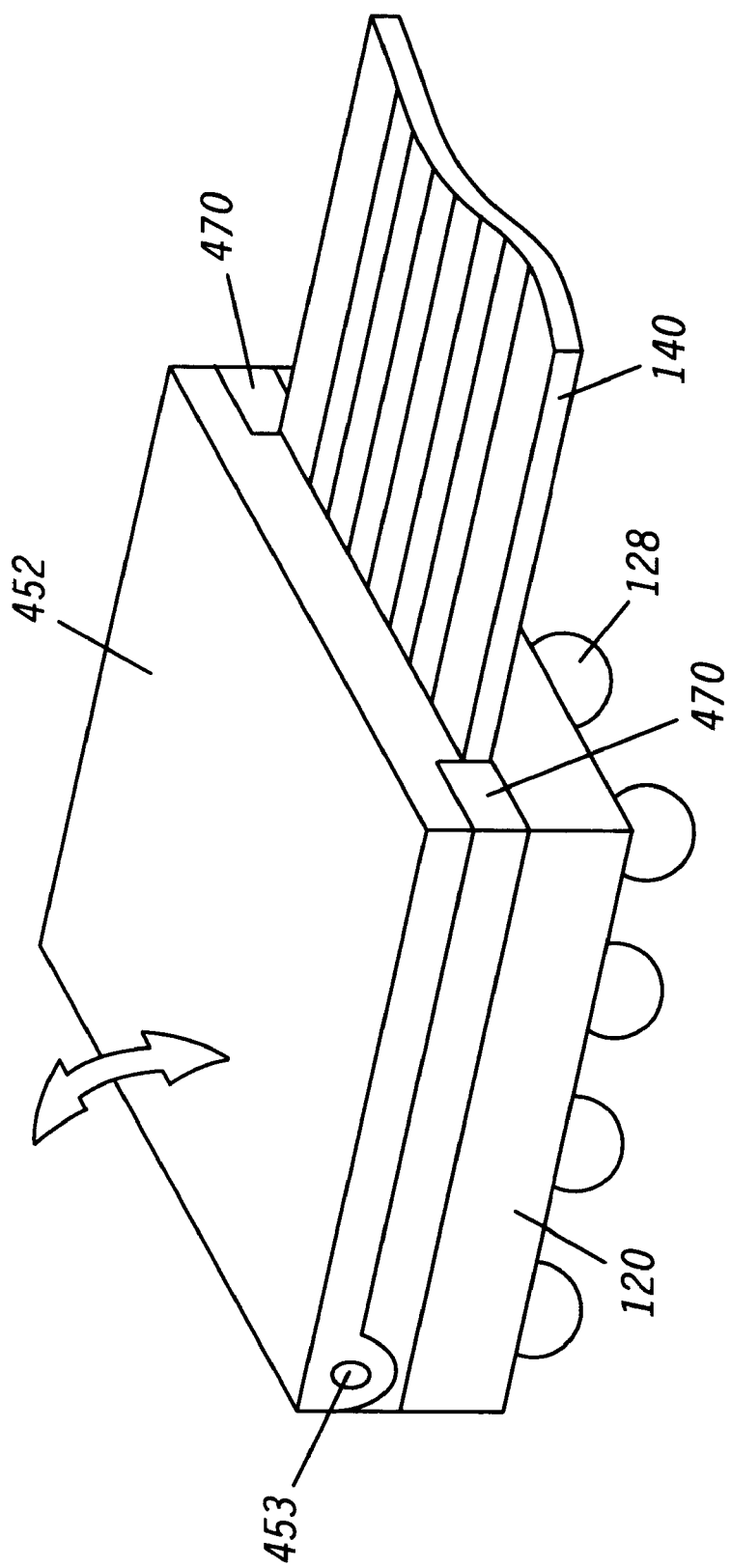
FIG. 4 is an isometric assembled view of an area efficient interconnect system in accordance with the invention.

Referring now to FIG. 4 an embodiment of the invention containing a means of pressing the flex against the substrate and aligning features is shown. An alignment means 470, such as a flex guide, aligns the flex 140 to the corresponding pads on the substrate 120 using the edge of the flex or by using another feature in the flex such as a notch or a hole. The flex guide can be an integral feature of the substrate, such as a ramp or datum edge, or it can be a post that secures the flex by means of post-in-a-hole, edge snaps, slot fits, or other methods. The pads on the flex are brought into final contact with the pads on the substrate with a door 452 that is hinged about an axis 453. A sliding actuator or a z-axis inserted rigid cover can be used in place of the hinged door 452. In one embodiment, the rigid cover can be pre-attached to the top side of the flex circuit via pressure-sensitive or thermoset adhesive or other lamination techniques. The door, actuator or rigid cover can lock into the flex guide with detent features, spring and latch mechanisms, press-fits, etc. Note that in all cases, the flex circuit is connected to the connector by insertion through the z-axis.

In summary, we have shown a novel method to interconnect flexible printed circuits utilizing area-efficient array technology that provides significant size and density advantages over conventional leaded interconnects/connectors. Our invention consumes less area on a PCB than traditional zero-insertion force (ZIF) and low-insertion force (LIF) connectors, because these connectors have linearly arranged edge leads. This permits higher I/O counts and interconnect densities, and improves solder process reliability. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A low insertion force array connector for providing a removable electrical connection between a flexible circuit and an intermediate substrate and for providing a permanent connection between the intermediate substrate and a printed circuit board, comprising:

a rigid intermediate substrate having a first pattern of pads on one side, said pads arranged in an X by Y array to receive a corresponding array of pads on the flexible circuit, wherein X and Y are integers equal to or greater than 2;

the intermediate substrate having a second pattern of pads on an opposite side arranged to be permanently joined to a corresponding array of pads on the printed circuit board, the second pattern of pads electrically interconnected to the first pattern of pads;

means for aligning the array of pads on the flexible circuit to the first pattern of pads; and compression means for providing sufficient force through a z-axis of the intermediate substrate to form a removable electrical connection between the array of pads on the flexible circuit and the first pattern of pads on the rigid intermediate substrate.

2. The low insertion force array connector as described in claim 1, wherein the first pattern of pads is arranged in an irregular matrix.

3. The low insertion force array connector as described in claim 1, wherein the first pattern of pads is an area array.

4. The low insertion force array connector as described in claim 1, wherein the first pattern of pads is a perimeter array.

5. The low insertion force array connector as described in claim 1, wherein the first pattern of pads comprises multiple rows of pads.

6. The low insertion force array connector as described in claim 1, wherein the second pattern of pads is solder bumped.

7. The low insertion force array connector as described in claim 1, wherein the second pattern of pads is electrically interconnected to the first pattern of pads by means of conductive vias.

8. The low insertion force array connector as described in claim 1, wherein the second pattern of pads is a ball grid array.

9. The low insertion force array connector as described in claim 1, wherein the compression means comprises a rigid cover.

10. The low insertion force array connector as described in claim 9, wherein the rigid cover comprises a hinged door.

11. The low insertion force array connector as described in claim 1, wherein the array of pads on the flexible circuit is on an end portion of the flexible circuit.

12. A low insertion force array connector for providing a removable electrical connection between a flexible circuit and an intermediate substrate and for providing a permanent connection between the intermediate substrate and a printed circuit board, comprising:

a rigid intermediate substrate having a first pattern of pads on one side, said pads arranged in an X by Y matrix to receive a corresponding array of pads on the flexible circuit, wherein X and Y are integers equal to or greater than 2;

the intermediate substrate having a solder bumped ball grid array on an opposite side for soldering to a corresponding array of pads on the printed circuit board, the solder bumps electrically interconnected to the first pattern of pads;

means for aligning the array of pads on the flexible circuit to the first pattern of pads; and compression means for providing sufficient force through a z-axis of the intermediate substrate to form a removable electrical connection between the array of pads on the flexible circuit and the first pattern of pads on the rigid intermediate substrate.

* * * * *